United States Patent
Syu et al.

(10) Patent No.: US 9,704,808 B2
(45) Date of Patent: Jul. 11, 2017

(54) SEMICONDUCTOR DEVICE AND WAFER LEVEL PACKAGE INCLUDING SUCH SEMICONDUCTOR DEVICE

(71) Applicant: MEDIATEK INC., Hsin-Chu (TW)

(72) Inventors: Shih-Yi Syu, Taoyuan (TW); Tung-Hsien Hsieh, Hsinchu County (TW); Che-Ya Chou, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/006,082

(22) Filed: Jan. 25, 2016

(65) Prior Publication Data

US 2016/0276277 A1 Sep. 22, 2016

Related U.S. Application Data

(60) Provisional application No. 62/135,935, filed on Mar. 20, 2015.

(51) Int. Cl.
*H01L 23/538* (2006.01)
*H01L 23/31* (2006.01)
(Continued)

(52) U.S. Cl.
CPC ...... *H01L 23/5386* (2013.01); *H01L 23/3171* (2013.01); *H01L 23/3192* (2013.01); *H01L 23/49811* (2013.01); *H01L 23/49838* (2013.01); *H01L 23/5226* (2013.01); *H01L 23/5384* (2013.01); *H01L 23/53228* (2013.01); *H01L 23/66* (2013.01); *H01L 24/05* (2013.01); *H01L 24/09* (2013.01); *H01L 24/17* (2013.01); *H01L 24/20* (2013.01); *H01L 24/25* (2013.01); *H01L 25/0655* (2013.01); *H01L 23/291* (2013.01); *H01L 23/525* (2013.01); *H01L 24/24* (2013.01); *H01L 24/96* (2013.01); *H01L 2224/02331* (2013.01); *H01L 2224/0401* (2013.01);
(Continued)

(58) Field of Classification Search
CPC ............. H01L 23/5386; H01L 23/3171; H01L 23/3192; H01L 23/66; H01L 24/05; H01L 24/20; H01L 24/25
See application file for complete search history.

(56) References Cited

U.S. PATENT DOCUMENTS

2008/0225523 A1* 9/2008 De Samber ............... F21K 9/00
362/249.01
2010/0237506 A1* 9/2010 Brunnbauer ............ H01L 24/11
257/773
(Continued)

FOREIGN PATENT DOCUMENTS

TW 200926312 6/2009
TW 201327744 A1 7/2013

*Primary Examiner* — Long Pham
(74) *Attorney, Agent, or Firm* — Winston Hsu

(57) ABSTRACT

An RDL structure on a passivation layer includes a first landing pad disposed directly above a first on-chip metal pad; a first via in a passivation layer to electrically connect the first landing pad with the first on-chip metal pad; a second landing pad disposed directly above the second on-chip metal pad; a second via in the passivation layer to electrically connect the second landing pad with the second on-chip metal pad; and at least five traces being disposed on the passivation layer and passing through a space between the first landing pad and the second landing pad.

26 Claims, 4 Drawing Sheets

(51) Int. Cl.
*H01L 23/66* (2006.01)
*H01L 23/00* (2006.01)
*H01L 23/498* (2006.01)
*H01L 23/522* (2006.01)
*H01L 23/532* (2006.01)
*H01L 25/065* (2006.01)
H01L 23/29 (2006.01)
H01L 23/525 (2006.01)

(52) U.S. Cl.
CPC ............... *H01L 2224/04105* (2013.01); *H01L 2224/05008* (2013.01); *H01L 2224/05013* (2013.01); *H01L 2224/05015* (2013.01); *H01L 2224/05022* (2013.01); *H01L 2224/05124* (2013.01); *H01L 2224/05147* (2013.01); *H01L 2224/05553* (2013.01); *H01L 2224/05555* (2013.01); *H01L 2224/05569* (2013.01); *H01L 2224/05572* (2013.01); *H01L 2224/05647* (2013.01); *H01L 2224/12105* (2013.01); *H01L 2224/13147* (2013.01); *H01L 2224/244* (2013.01); *H01L 2224/245* (2013.01); *H01L 2224/24137* (2013.01); *H01L 2224/25175* (2013.01); *H01L 2224/73209* (2013.01); *H01L 2924/14* (2013.01); *H01L 2924/18162* (2013.01)

(56) References Cited

U.S. PATENT DOCUMENTS

2012/0299192 A1 11/2012 Chen
2013/0292813 A1 11/2013 Yang
2014/0191390 A1 7/2014 Chuang \* cited by examiner

SEMICONDUCTOR DEVICE AND WAFER LEVEL PACKAGE INCLUDING SUCH SEMICONDUCTOR DEVICE

CROSS REFERENCE TO RELATED APPLICATIONS

This application claims the benefit of U.S. provisional application No. 62/135,935 filed Mar. 20, 2015.

BACKGROUND

The present invention relates to a semiconductor device and package having fine RDL pitch and improved signal integrity.

Cost and size reduction is driving packaging industry to new measures and approaches. Wafer level packaging is one approach, which the packaging industry is looking into for size and cost reduction.

For example, Fan-Out Wafer Level Packaging (FOWLP), which is known in the art, integrates at least two individual integrated circuit (IC) dies in a side-by-side configuration into one molded semiconductor package having fan-out redistribution layer (RDL) and post passivation interconnection (PPI). The two IC dies are interconnected to each other through the RDL. FOWLP promises superior form factor, pin count, and thermal performance to existing flip-chip ball grid array (FCBGA) packages.

However, as more and more functions are incorporated into one single IC die, the die-to-die signal points have dramatically increased. The increased die-to-die signal points results in considerable loss of routing space in the redistribution layer (RDL). Currently, at most three to four signal traces can be arranged between two adjacent landing pads due to the relatively large size of each landing pad. There is no enough room for disposing the shielding traces. This adversely influences the signal integrity in high-speed applications because of crosstalk between signals.

Accordingly, there is a need in this industry to provide an improved wafer level package with fine RDL pitch and improved signal integrity.

SUMMARY

It is an objective of the claimed invention to provide an improved semiconductor device and package having fine RDL pitch and improved signal integrity.

According to one aspect of the invention, a semiconductor device includes an integrated circuit (IC) die having an active surface, wherein at least a first on-chip metal pad and a second on-chip metal pad in close proximity to the first on-chip metal pad are disposed on the active surface; a passivation layer on the active surface and covering the first on-chip metal pad and the second on-chip metal pad; and a redistribution layer (RDL) structure on the passivation layer. The RDL structure comprises a first landing pad disposed directly above the first on-chip metal pad; a first via in the RDL structure to electrically connect the first landing pad with the first on-chip metal pad; a second landing pad being disposed directly above the second on-chip metal pad; a second via in the RDL structure to electrically connect the second landing pad with the second on-chip metal pad; and at least three traces being disposed on the RDL structure and passing through a space between the first landing pad and the second landing pad.

According to another aspect of the invention, a wafer level package includes an IC die having an active surface, wherein at least a first on-chip metal pad and a second on-chip metal pad in close proximity to the first on-chip metal pad are disposed on the active surface; a passivation layer on the active surface and covering the first on-chip metal pad and the second on-chip metal pad; a molding compound encapsulating the IC die except for the active surface; and a redistribution layer (RDL) structure on the passivation layer and on the molding compound. The RDL structure includes a first landing pad disposed directly above the first on-chip metal pad; a first via in the RDL structure to electrically connect the first landing pad with the first on-chip metal pad; a second landing pad being disposed directly above the second on-chip metal pad; a second via in the RDL structure to electrically connect the second landing pad with the second on-chip metal pad; and at least three traces being disposed on the RDL structure and passing through a space between the first landing pad and the second landing pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 1:
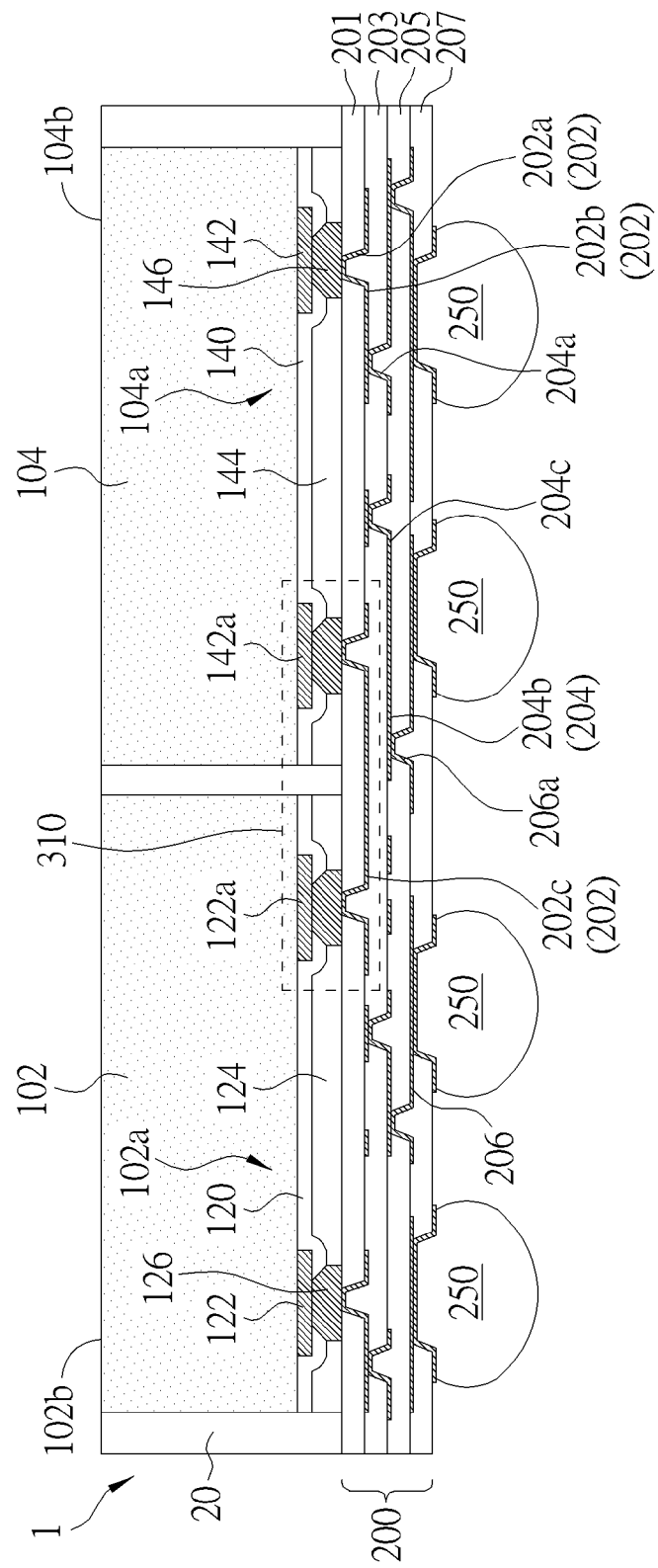
FIG. 1 is a schematic, cross-sectional diagram showing an exemplary fan-out wafer level package (FOWLP) according to one embodiment of the invention.

FIG. 1 is a schematic, cross-sectional diagram showing an exemplary semiconductor device package according to one embodiment of the invention. The semiconductor device package 1 may be a Fan-Out Wafer Level Packaging (FOWLP) having molded integrated circuit (IC) dies arranged in a side-by-side configuration, but not limited thereto. Although a multi-die WLP package is illustrated, it is understood that the present invention may be applicable to single-die packages.

As shown in FIG. 1, the exemplary semiconductor device package 1 comprises two IC dies 102 and 104 arranged in a side-by-side configuration and molded by using a molding material 20 such as epoxy, resin, or other suitable molding compounds. The IC dies 102 and 104 have active surfaces 102a and 104a, respectively (in this figure both facing downward). On the active surfaces 102a and 104a, on-chip metal pads 122 and 142 such as aluminum (Al) pads are provided. These on-chip metal pads 122 and 142 are covered with passivation layers 120 and 140, respectively. According to the illustrated embodiment, the passivation layers 120 and 140 may comprise silicon oxide, silicon nitride, silicon oxynitride, undoped silicon glass, or any combination thereof.

Optionally, dielectric capping layers 124 and 144 may be disposed directly on the passivation layers 120 and 140 respectively, thereby providing a planar major surface that is substantially flush with a surface of the molding material 20 surrounding the two IC dies 102 and 104. According to the illustrated embodiment, the dielectric capping layers 124 and 144 are in direct contact with the passivation layers 120 and 140, respectively. According to the illustrated embodiment, the dielectric capping layers 124 and 144 may comprise a polymeric material such as polyimide, a laminating tape, a backside grinding tape, an adhesive, an UV tap, or the like.

Although not shown in this figure, it is understood that the IC dies 102 and 104 may further comprise metal interconnection schemes underneath the passivaiton layers 120 and 140, respectively. For example, the aforesaid metal interconnection schemes may include but not limited to ultra-low-k dielectric layers, inter-layer dielectric (ILD) layers, and multi-layer copper metal layers distributed or damascened in the dielectric capping layers. The metal interconnection schemes may be constructed on a semiconductor substrate such as a silicon substrate in and on which a plurality of semiconductor circuit elements such as transistors may be located. The details of the inner structures under the passivation layers 120 and 140 are omitted for the sake of simplicity.

Openings may be formed in the dielectric capping layer 124 and the passivation layers 120 and 140. Each of the openings may expose a portion of the top surface of each of the metal pads 122 and 142. Conductive pillar bumps 126 and 146 such as copper pillar bumps or copper contact plugs may be formed within the openings and fill up the openings on the metal pads 122 and 142, respectively. It is to be understood that in other embodiments the dielectric capping layer 124 and the conductive pillar bumps 126 may be omitted.

A redistribution layer (RDL) structure 200 is formed directly on the dielectric capping layer 124 and on the molding material 20 surrounding the two IC dies 102 and 104 generally for signal fan-out purposes. According to the illustrated embodiment, the RDL structure 200 may comprise a plurality of insulating layers 201, 203, 205, and 207, for example, and a plurality of metal layers 202, 204, and 206 in and on the plurality of insulating layers 201, 203, 205, and 207. The insulating layers 201, 203, 205 and 207 may comprise organic materials or polymeric materials including but not limited to polyimide, benzocyclobutene (BCB), polybenzoxazole (PBO), or the like. In other embodiments, the insulating layers 201, 203, 205, and 207 may comprise inorganic materials.

For example, the metal layer 202 may comprise circuit features such as via 202a disposed directly above each of the conductive pillar bumps 126 and 146, a landing pad 202b, and a fine trace 202c extending and communicating between via and landing pad, or between landing pad and landing pad on the insulating layer 201. In FIG. 1, an exemplary region indicated by the dashed lines 310 shows the route for die-to-die signal transmitting, which includes but not limited to die-to-die metal pads 122a and 142a, vias 202a, landing pads 202b on the metal pads and vias, and fine trace 202c between the landing pads 202b.

As alluded to hereinabove, as more and more functions are incorporated into one single IC die, the die-to-die signal points have dramatically increased. The increased die-to-die signal points results in considerable loss of routing space in the RDL. Conventionally, at most three to four signal traces can be arranged between two adjacent landing pads due to the relatively large size of each landing pad. There is no enough room for disposing the shielding traces. This adversely influences the signal integrity in high-speed applications because of crosstalk between signals. This invention addresses this problem.

Figure 2:
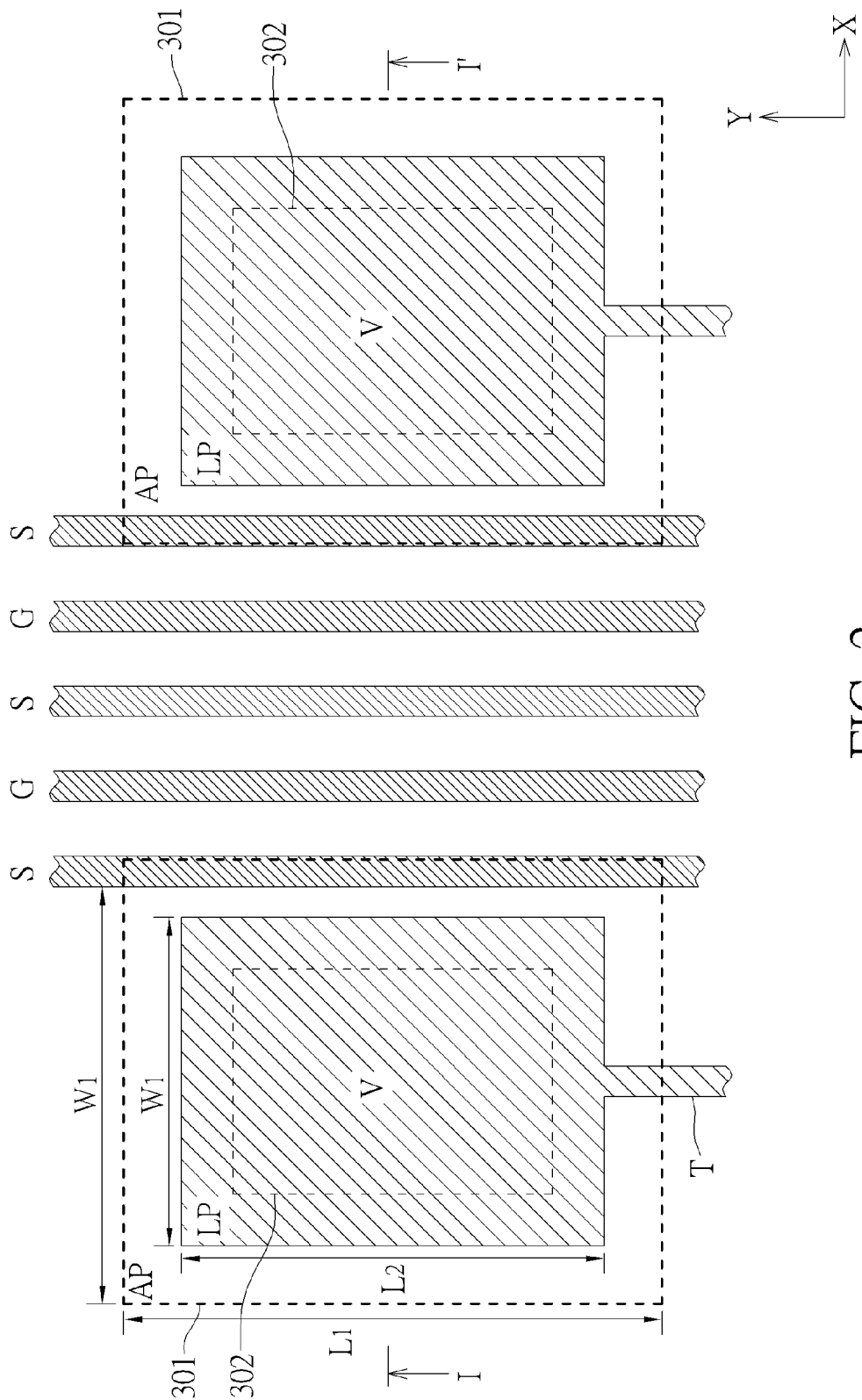
FIG. 2 is a perspective plan view showing a portion of aluminum pads, copper vias, traces, and landing pads in the redistribution layer according to one embodiment of the invention.
Figure 3:
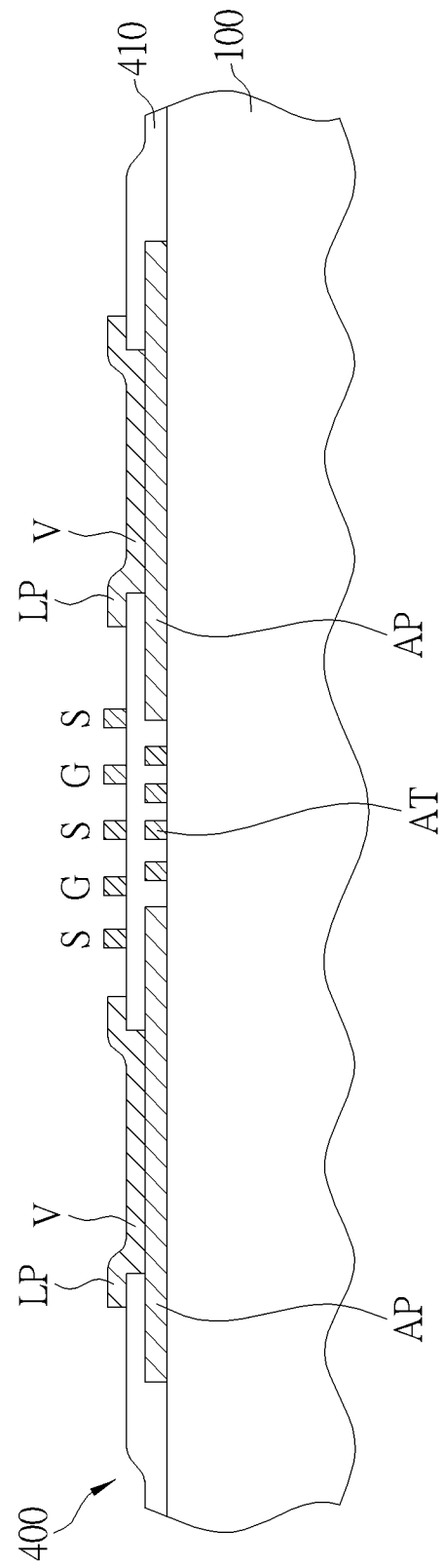
FIG. 3 is a schematic, cross-sectional diagram taken along line I-I' in FIG. 2.

Please refer to FIG. 2 and FIG. 3. FIG. 2 is a perspective plan view showing a portion of the RDL structure of a fan-out wafer level package (FOWLP) according to one embodiment of the invention. FIG. 3 is a schematic, cross-sectional diagram taken along line I-I' in FIG. 2. As shown in FIG. 2 and FIG. 3, the RDL structure 400 fabricated on an IC die 100 may comprise two adjacent on-chip aluminum (Al) pads (AP), which are indicated by the dashed line 301. The Al pads (AP) may be covered with a passivation layer 410. According to the illustrated embodiment, the passivation layer 410 may comprise silicon oxide, silicon nitride, silicon oxynitride, undoped silicon glass, or any combination thereof. In other embodiments, the passivation layer 410 may comprise organic materials such as polyimide or the like. It is to be understood that more dielectric layers and metal layers may be formed on the passivation layer 410 for further connection as set forth in FIG. 1.

Openings may be formed in the passivation layer 410. Each of the openings may expose a central portion of the top surface of each of the Al pads (AP). A copper via (V), which is indicated by the dashed line 302, is formed directly on each of the Al pads (AP). A landing pad (LP) is formed directly on each of the copper vias (V). According to the illustrated embodiment, at least five fine traces S, G, S, G, S may pass through the space between the two adjacent landing pads (LP). The five fine traces S, G, S, G, S may comprise copper, but not limited thereto.

According to the illustrated embodiment, each of the Al pads (AP) may have a rectangular shape or oval shape when viewed from the above. Each of the Al pads (AP) may have a longitudinal length L1 and a width W1. According to the illustrated embodiment, the longitudinal direction of each of the Al pads (AP) is in parallel with a reference y-axis, which may be the signal transmitting direction (die-to-die direction) between two IC dies 102 and 104 as set forth in FIG. 1. An aspect ratio of the each of the Al pads (AP) is defined as L1/W1, which may range between 2~3, especially range between 1~3, for example. The width W1 may be one-half the longitudinal length L1, but not limited thereto. In some embodiments, the width W1 may be smaller than one-half the longitudinal length L1, but not limited thereto. For not limiting example, longitudinal length L1 may range between 35~55 micrometers, for example, 45 micrometers, and the width W1 may range between 15~30 micrometers, for example, 20 micrometers.

According to the illustrated embodiment, each of the landing pads (LP) may have a rectangular shape or oval shape when viewed from the above. Each of the landing pads (LP) may have a longitudinal length L2 and a width W2. According to the illustrated embodiment, the longitudinal direction of each of the landing pads (LP) is in parallel with the reference y-axis, which may be the signal transmitting direction (die-to-die direction) between two IC dies 102 and 104 as set forth in FIG. 1. An aspect ratio of the each of the landing pads (LP) is defined as L2/W2, which may range between 2~3, especially range between 1~3, for example. The width W2 may be one-half the longitudinal length L2, but not limited thereto. In some embodiments, the width W2 may be smaller than one-half the longitudinal length L2, but not limited thereto. For not limiting example, longitudinal length L2 may range between 30~50 micrometers, for example, 40 micrometers, and the width W2 may range between 10~25 micrometers, for example, 18 micrometers.

According to the illustrated embodiment, the five fine traces S, G, S, G, S extending along the reference y-axis (or die-to-die direction) between the two adjacent landing pads (LP) may transmit die-to-die signals. According to the illustrated embodiment, the two fine traces G may transmit ground signal and may function as shielding traces interposed between two high-speed signal traces, i.e. fine traces denoted with S. The term "SGS" may refer to a circuit layout structure comprising an intervening reference (e.g. grounded) trace sandwiched by a pair of high-speed or high-frequency signal traces, for example, operated greater than 1 Gb/s. The term "SGSGS" may refer to two intervening reference traces between three high-speed or high-frequency signal traces. By providing such configuration, the signal integrity can be significantly improved.

According to the illustrated embodiment, redistribution layer under the passivation layer 410 may be provided between the two Al pads (AP). For example, in FIG. 3, at least four aluminum traces (AT), which also extend along the reference y-axis (or die-to-die direction), are provided. It is advantageous to use the present invention because the landing pads (LP) and/or the Al pads (AP), especially those located within the region indicated by the dashed lines 310 in FIG. 1, have rectangular shape or oval shape when viewed from the above and therefore the space therebetween is widened to thereby accommodating more RDL traces. The SGSGS trace configuration depicted in FIG. 2 and FIG. 3 improves the signal integrity in the RDL level.

Figure 4:
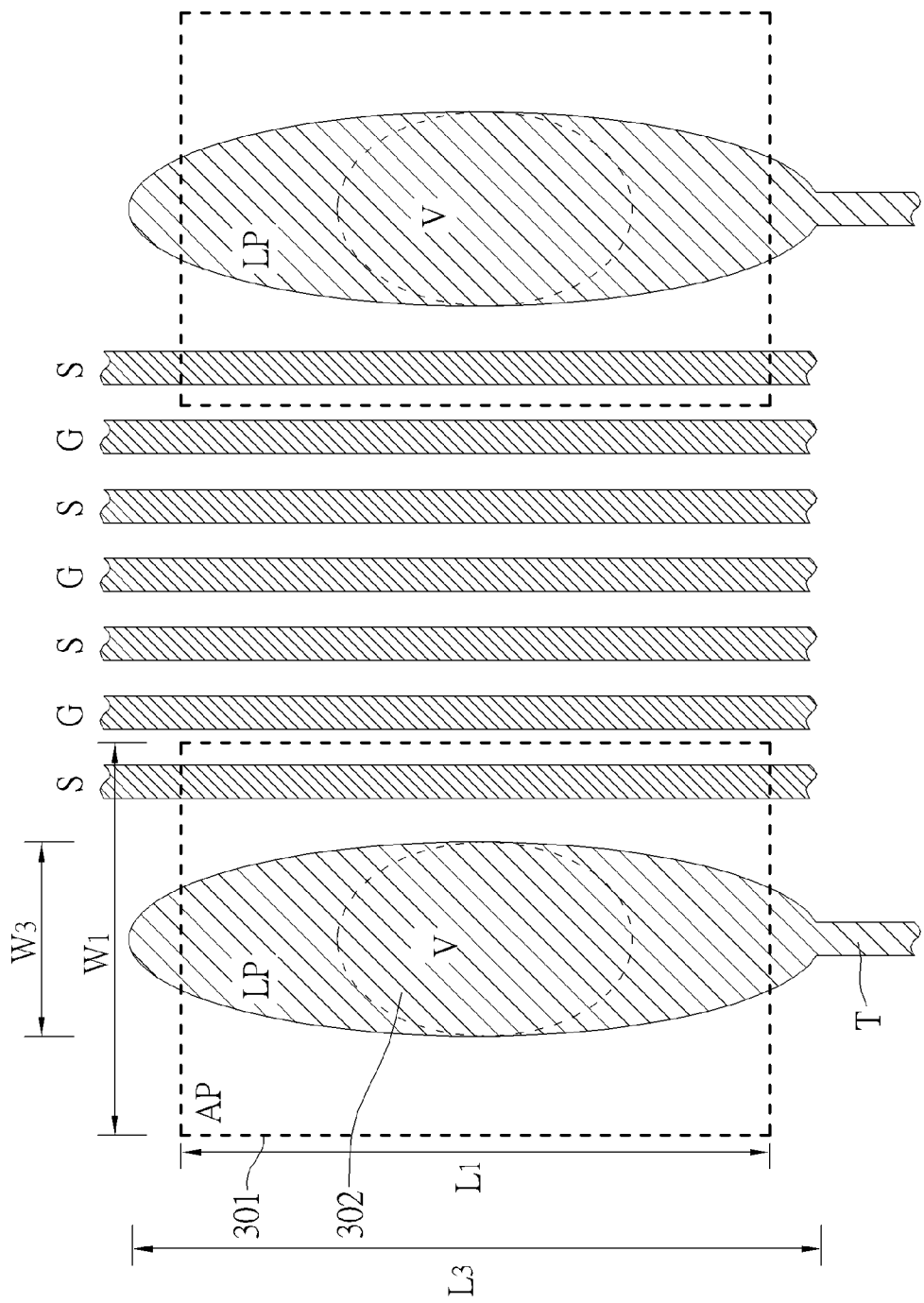
FIG. 4 is a perspective plan view showing a portion of aluminum pads, copper vias, traces, and landing pads in the redistribution layer according to another embodiment of the invention.

FIG. 4 is a perspective plan view showing a portion of aluminum pads, copper vias, traces, and landing pads in the redistribution layer according to another embodiment of the invention. As shown in FIG. 4, when compared to the landing pads in FIG. 2, the landing pads (LP) in FIG. 4 has a more slender shape, which has a longitudinal length L3 that is greater than L2 and a width W3 that is smaller than W2. Due to the more slender shape of the landing pads (LP) in FIG. 4, the space between the two adjacent landing pads (LP) is further widened. Therefore, more RDL traces may be arranged in the space. For example, seven traces denoted by SGSGSGS comprising four high-speed signal traces and three reference or grounded traces are shown in FIG. 4. According to the illustrated embodiment, the landing pads (LP) in FIG. 4 have substantially the same surface area as that of the landing pads (LP) shown in FIG. 2. In some cases, part of the boundary of the copper via (V) as indicated by the dashed line 302 may partially overlaps with part of the boundary or peripheral edge of the landing pad (LP).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an integrated circuit (IC) die having an active surface, wherein at least a first on-chip metal pad and a second on-chip metal pad in close proximity to the first on-chip metal pad are disposed on the active surface;
   a passivation layer on the active surface and covering the first on-chip metal pad and the second on-chip metal pad; and
   a redistribution layer (RDL) structure on the passivation layer, the RDL structure comprising:
   a first landing pad disposed directly above the first on-chip metal pad;
   a first via in the RDL structure to electrically connect the first landing pad with the first on-chip metal pad;
   a second landing pad disposed directly above the second on-chip metal pad;
   a second via in the RDL structure to electrically connect the second landing pad with the second on-chip metal pad; and
   at least three traces being disposed on the RDL structure and passing through a space between the first landing pad and the second landing pad, wherein the three traces comprise two intervening reference traces between three high-speed signal traces to thereby form a GSG RDL trace configuration.

2. The semiconductor device according to claim 1, wherein the first on-chip metal pad is an aluminum pad.

3. The semiconductor device according to claim 2, wherein the second on-chip metal pad is an aluminum pad.

4. The semiconductor device according to claim 1, wherein the passivation layer comprises silicon oxide, silicon nitride, silicon oxynitride, undoped silicon glass, or any combination thereof.

5. The semiconductor device according to claim 1, wherein the first landing pad and the first via are composed of copper.

6. The semiconductor device according to claim 5, wherein the second landing pad and the second via are composed of copper.

7. The semiconductor device according to claim 1, wherein the high-speed signal traces are operated greater than 1 Gb/s.

8. The semiconductor device according to claim 1, wherein the two intervening reference traces transmit a ground signal.

9. The semiconductor device according to claim 1, wherein the first landing pad and the second landing pad both have a rectangular shape or oval shape when viewed from the above.

10. The semiconductor device according to claim 9, wherein the first landing pad and the second landing pad both have an aspect ratio ranging between 1~3.

11. The semiconductor device according to claim 1, wherein the first on-chip metal pad and the second on-chip metal pad have a rectangular shape or oval shape when viewed from the above.

12. The semiconductor device according to claim 11, wherein the first on-chip metal pad and the second on-chip metal pad both have an aspect ratio ranging between 1~3.

13. The semiconductor device according to claim 11, wherein at least four aluminum traces extending along a die-to-die direction are disposed between the first on-chip metal pad and the second on-chip metal pad.

14. A wafer level package, comprising:
an integrated circuit (IC) die having an active surface, wherein at least a first on-chip metal pad and a second on-chip metal pad in close proximity to the first on-chip metal pad are disposed on the active surface;
a passivation layer on the active surface and covering the first on-chip metal pad and the second on-chip metal pad;
a molding compound encapsulating the IC die except for the active surface; and
a redistribution layer (RDL) structure on the passivation layer and on the molding compound, the RDL structure comprising:
  a first landing pad disposed directly above the first on-chip metal pad;
  a first via in the RDL structure to electrically connect the first landing pad with the first on-chip metal pad;
  a second landing pad being disposed directly above the second on-chip metal pad;
  a second via in the RDL structure to electrically connect the second landing pad with the second on-chip metal pad; and
  at least three traces being disposed on the RDL structure and passing through a space between the landing pad and the second landing pad, wherein the three traces comprise two intervening reference traces between three high-speed signal traces to thereby form a GSG RDL trace configuration.

15. The wafer level package according to claim 14, wherein the first on-chip metal pad is an aluminum pad.

16. The wafer level package according to claim 15, wherein the second on-chip metal pad is an aluminum pad.

17. The wafer level package according to claim 14, wherein the passivation layer comprises silicon oxide, silicon nitride, silicon oxynitride, undoped silicon glass, or any combination thereof.

18. The wafer level package according to claim 14, wherein the first landing pad and the first via are composed of copper.

19. The wafer level package according to claim 18, wherein the second landing pad and the second via are composed of copper.

20. The wafer level package according to claim 14, wherein the high-speed signal traces are operated greater than 1 Gb/s.

21. The wafer level package according to claim 14, wherein the two intervening reference traces transmit a ground signal.

22. The wafer level package according to claim 14, wherein the first landing pad and the second landing pad both have a rectangular shape or oval shape when viewed from the above.

23. The wafer level package according to claim 22, wherein the first landing pad and the second landing pad both have an aspect ratio ranging between 1~3.

24. The wafer level package according to claim 14, wherein the first on-chip metal pad and the second on-chip metal pad have a rectangular shape or oval shape when viewed from the above.

25. The wafer level package according to claim 24, wherein the first on-chip metal pad and the second on-chip metal pad both have an aspect ratio ranging between 1~3.

26. The wafer level package according to claim 24, wherein at least four aluminum traces extending along a die-to-die direction are disposed between the first on-chip metal pad and the second on-chip metal pad.

* * * * *